United States Patent
Hsiao et al.

(10) Patent No.: US 9,343,436 B2
(45) Date of Patent: May 17, 2016

(54) STACKED PACKAGE AND METHOD OF MANUFACTURING THE SAME

(71) Applicant: TAIWAN SEMICONDUCTOR MANUFACTURING COMPANY, LTD., Hsinchu (TW)

(72) Inventors: Yi-Li Hsiao, Hsinchu (TW); Li-Yen Lin, Wujie Township (TW); Chih-Hang Tung, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 56 days.

(21) Appl. No.: 14/511,051

(22) Filed: Oct. 9, 2014

(65) Prior Publication Data

US 2015/0021755 A1   Jan. 22, 2015

Related U.S. Application Data

(63) Continuation-in-part of application No. 13/033,840, filed on Feb. 24, 2011, now abandoned, which is a continuation-in-part of application No. 12/878,319, filed on Sep. 9, 2010, now abandoned.

(60) Provisional application No. 61/418,281, filed on Nov. 30, 2010.

(51) Int. Cl.
*H01L 25/065* (2006.01)
*H01L 25/00* (2006.01)
(Continued)

(52) U.S. Cl.
CPC .............. *H01L 25/0657* (2013.01); *F28D 15/02* (2013.01); *H01L 23/053* (2013.01);
(Continued)

(58) Field of Classification Search
CPC . H05K 7/20; H05K 7/20272; H05K 7/20309; H05K 7/20936; G06F 1/20; H01L 23/34; H01L 23/473; H01L 51/40; H05D 1/12; C23C 16/00; C23C 16/30; C23C 16/40; F28F 2245/02; F28F 7/00; B05D 1/60
USPC .......... 361/679.46, 679.53, 679.54, 688, 689, 361/698, 699, 700, 705, 707, 710, 714, 361/715; 165/80.2, 80.4, 80.5, 104.19, 165/104.21, 104.26, 104.33, 104.34, 185; 257/686, 698, 707, 713–718, 722, 723, 257/734, 737, 738, 778, 787; 62/3.3, 3.6, 62/259.2; 438/99, 107, 479, 456, 586, 438/637; 427/58, 115, 180, 255.17, 255.18, 427/282, 569, 577, 248.1
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| DE | 20201110180 U1 * | 10/2011 | ............ H01L 23/427 |
| WO | WO2008/093294 A1 * | 8/2008 | ............ H01L 41/053 |

*Primary Examiner* — Michail V Datskovskiy
(74) *Attorney, Agent, or Firm* — Hauptman Ham, LLP

(57) ABSTRACT

A stacked package includes a substrate, and a first structure bonded to the substrate. The first structure has a plurality of bumps, and a first hydrophilic coating is on sidewalls of the first structure. The stacked package further includes a second structure bonded to the plurality of bumps. The first hydrophilic coating is on sidewalls of the second structure. The first structure is between the second structure and the substrate. The stacked package further includes a housing, wherein the housing defines a volume enclosing the first structure and the second structure. A second hydrophilic coating is on sidewalls of an inner surface of the housing. The stacked package further includes a cooling fluid within the volume enclosing the first structure and the second structure. A top surface of the cooling fluid is above a top surface of the second structure.

20 Claims, 9 Drawing Sheets

(51) Int. Cl.
*H01L 23/44* (2006.01)
*H01L 23/473* (2006.01)
*H01L 23/00* (2006.01)
*H01L 23/053* (2006.01)
*F28D 15/02* (2006.01)
*H01L 23/34* (2006.01)
*H01L 25/16* (2006.01)
*H01L 23/31* (2006.01)
*H05K 7/20* (2006.01)
*G06F 1/20* (2006.01)

(52) U.S. Cl.
CPC ............ H01L23/3185 (2013.01); H01L 23/34 (2013.01); H01L 23/473 (2013.01); H01L 24/17 (2013.01); H01L 24/81 (2013.01); H01L 25/16 (2013.01); H01L 25/50 (2013.01); *H01L 24/16* (2013.01); *H01L 2224/131* (2013.01); *H01L 2224/16145* (2013.01); *H01L 2224/16227* (2013.01); *H01L 2224/175* (2013.01); *H01L 2224/17181* (2013.01); *H01L 2224/17183* (2013.01); *H01L 2224/17515* (2013.01); *H01L 2225/06513* (2013.01); *H01L 2225/06517* (2013.01); *H01L 2225/06589* (2013.01); *H01L 2924/01029* (2013.01); *H01L 2924/0715* (2013.01); *H01L 2924/1433* (2013.01); *H01L 2924/1434* (2013.01); *H01L 2924/1461* (2013.01); *H01L 2924/15788* (2013.01)

(56) References Cited

U.S. PATENT DOCUMENTS

| | | | |
|---|---|---|---|
| 5,075,253 A | 12/1991 | Sliwa, Jr. | |
| 5,144,811 A | 9/1992 | Brodie et al. | |
| 5,189,911 A | 3/1993 | Ray et al. | |
| 5,270,572 A | 12/1993 | Nakajima et al. | |
| 5,380,681 A | 1/1995 | Hsu | |
| 5,481,133 A | 1/1996 | Hsu | |
| 5,528,456 A | 6/1996 | Takahashi | |
| 5,737,186 A | 4/1998 | Fuesser et al. | |
| 5,785,754 A * | 7/1998 | Yamamoto | G21K 1/10 117/89 |
| 5,933,323 A | 8/1999 | Bhatia et al. | |
| 6,002,177 A | 12/1999 | Gaynes et al. | |
| 6,172,874 B1 | 1/2001 | Bartilson | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,349,760 B1 | 2/2002 | Budelman | |
| 6,355,501 B1 | 3/2002 | Fung et al. | |
| 6,366,462 B1 | 4/2002 | Chu et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,550,263 B2 | 4/2003 | Patel et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,611,057 B2 | 8/2003 | Mikubo et al. | |
| 6,661,085 B2 | 12/2003 | Kellar et al. | |
| 6,717,812 B1 | 4/2004 | Pinjala et al. | |
| 6,762,076 B2 | 7/2004 | Kim et al. | |
| 6,790,702 B2 * | 9/2004 | Farrar | H01L 23/4822 257/686 |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,015,572 B2 | 3/2006 | Yamaji | |
| 7,019,971 B2 | 3/2006 | Houle et al. | |
| 7,032,392 B2 | 4/2006 | Koeneman et al. | |
| 7,037,804 B2 | 5/2006 | Kellar et al. | |
| 7,056,807 B2 | 6/2006 | Kellar et al. | |
| 7,057,270 B2 | 6/2006 | Moshayedi | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,159,414 B2 | 1/2007 | Tilton et al. | |
| 7,180,165 B2 | 2/2007 | Ellsberry et al. | |
| 7,180,742 B1 | 2/2007 | Chayut | |
| 7,201,214 B2 * | 4/2007 | Munch | F04B 17/00 165/104.33 |
| 7,215,033 B2 | 5/2007 | Lee et al. | |
| 7,274,568 B1 | 9/2007 | Chayut | |
| 7,276,799 B2 | 10/2007 | Lee et al. | |
| 7,279,795 B2 | 10/2007 | Periaman et al. | |
| 7,289,326 B2 | 10/2007 | Heydari et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,344,363 B2 | 3/2008 | Munch et al. | |
| 7,345,350 B2 | 3/2008 | Sinha | |
| 7,362,580 B2 | 4/2008 | Hua et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,482,207 B2 * | 1/2009 | Brown | B82Y 10/00 257/E23.179 |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,561,425 B2 | 7/2009 | Mindock et al. | |
| 7,576,435 B2 | 8/2009 | Chao | |
| 7,611,923 B2 | 11/2009 | Fasano et al. | |
| 7,692,926 B2 * | 4/2010 | Henderson | F28D 15/043 165/104.21 |
| 7,781,263 B2 * | 8/2010 | Winter | H01L 23/34 257/E21.499 |
| 7,834,450 B2 | 11/2010 | Kang | |
| 7,849,914 B2 | 12/2010 | Di Stefano et al. | |
| 7,913,507 B2 * | 3/2011 | Kondo | H01L 23/427 62/259.2 |
| 7,935,565 B2 * | 5/2011 | Brown | B82Y 10/00 438/665 |
| 7,990,711 B1 * | 8/2011 | Andry | H01L 23/147 165/80.4 |
| 8,236,379 B2 * | 8/2012 | Kobrin | B05D 1/60 427/180 |
| 8,349,517 B2 * | 1/2013 | Li | H01M 8/0206 252/519.33 |
| 8,349,652 B2 * | 1/2013 | Koyanagi | H01L 21/6835 156/578 |
| 8,363,402 B2 * | 1/2013 | Brunschwiler | H01L 23/473 165/80.4 |
| 8,399,974 B1 * | 3/2013 | Huneke | H01L 24/29 257/686 |
| 8,782,889 B2 * | 7/2014 | Chen | B22F 7/08 165/104.26 |
| 8,824,162 B2 * | 9/2014 | Alvarez | H05K 5/0213 174/546 |
| 8,997,840 B2 * | 4/2015 | Yang | B05D 5/04 165/104.26 |
| 9,072,197 B2 * | 6/2015 | Murata | H05K 7/20236 |
| 2001/0011773 A1 * | 8/2001 | Havens | H01L 21/56 257/734 |
| 2003/0104170 A1 * | 6/2003 | Johnston | A61F 13/53708 428/167 |
| 2003/0123225 A1 | 7/2003 | Miller | |
| 2003/0159456 A1 | 8/2003 | Cowans | |
| 2004/0190255 A1 | 9/2004 | Cheon | |
| 2004/0264124 A1 | 12/2004 | Patel et al. | |
| 2005/0067694 A1 | 3/2005 | Pon et al. | |
| 2006/0023424 A1 | 2/2006 | Nakamura et al. | |

(56) References Cited

U.S. PATENT DOCUMENTS

| | | | |
|---|---|---|---|
| 2006/0126309 A1 | 6/2006 | Bolle et al. | |
| 2006/0274501 A1 | 12/2006 | Miller | |
| 2007/0241449 A1 | 10/2007 | Colbert et al. | |
| 2008/0013291 A1 | 1/2008 | Bork | |
| 2008/0128896 A1 | 6/2008 | Toh et al. | |
| 2008/0141875 A1 | 6/2008 | Fahrenback | |
| 2008/0225493 A1 | 9/2008 | Barth | |
| 2009/0000332 A1* | 1/2009 | Kondo | H01L 23/427 62/509 |
| 2009/0052134 A1 | 2/2009 | Casteel et al. | |
| 2009/0052137 A1 | 2/2009 | Ouyang | |
| 2009/0231811 A1 | 9/2009 | Tokuyama et al. | |
| 2009/0268404 A1 | 10/2009 | Chu et al. | |
| 2009/0279220 A1 | 11/2009 | Hauenstein et al. | |
| 2009/0294954 A1 | 12/2009 | Bakir et al. | |
| 2010/0019377 A1 | 1/2010 | Arvelo et al. | |
| 2010/0117209 A1 | 5/2010 | Bezama et al. | |
| 2010/0127390 A1 | 5/2010 | Barth | |
| 2010/0134947 A1 | 6/2010 | Goudy | |
| 2010/0187682 A1 | 7/2010 | Pinjala et al. | |
| 2010/0187683 A1 | 7/2010 | Bakir et al. | |
| 2010/0246117 A1 | 9/2010 | Brunschwiler et al. | |
| 2011/0092064 A1 | 4/2011 | Liu et al. | |
| 2011/0101527 A1 | 5/2011 | Cheng et al. | |
| 2011/0205708 A1 | 8/2011 | Andry et al. | |
| 2011/0292595 A1 | 12/2011 | El-Essawy et al. | |
| 2011/0292601 A1 | 12/2011 | Campbell et al. | |
| 2012/0188719 A1 | 7/2012 | El-Essawy et al. | |
| 2012/0227936 A1* | 9/2012 | Yang | B05D 5/04 165/104.26 |

* cited by examiner

STACKED PACKAGE AND METHOD OF MANUFACTURING THE SAME

PRIORITY CLAIM

The present application is a continuation-in-part of U.S. application Ser. No. 13/033,840, filed Feb. 24, 2011, which is a Continuation-in-Part of U.S. application Ser. No. 12/878,319, filed Sep. 9, 2010, and claims priority of U.S. Provisional Patent Application Ser. No. 61/418,281, filed on Nov. 30, 2010, which are all incorporated herein by reference in their entireties.

BACKGROUND

The disclosure relates generally to stacked die packages and, more particularly, to cooling mechanisms for stacked die packages.

Recently, three-dimensional integrated circuit (3D IC) packages, or stacked die packages, have provided a possible solution to traditional two-dimensional (2D) ICs in overcoming the interconnect scaling barrier and for improving performance. In stacked die packages, multiple dies are stacked together using vertical through silicon vias (TSVs) where longer wire connections and inter-die input/output (I/O) pads are eliminated. The overall performance is significantly improved with faster and more power efficient inter-core communication across multiple silicon layers.

As effective as 3D IC technology is, 3D IC technology faces critical thermal management challenges. When multiple dies are stacked vertically in a package, the thermal path for dissipating heat generated by the dies is limited. Stacked die packages are typically encapsulated in a material that does not dissipate heat well and, if the heat dissipation problem is not addressed, the dies may overheat during operation leading to possible problems with transistor performance and reliability. To address the heat dissipation problem, cooling systems that use thermal via and liquid micro channels have been proposed. However, such systems are complex and expensive to implement.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
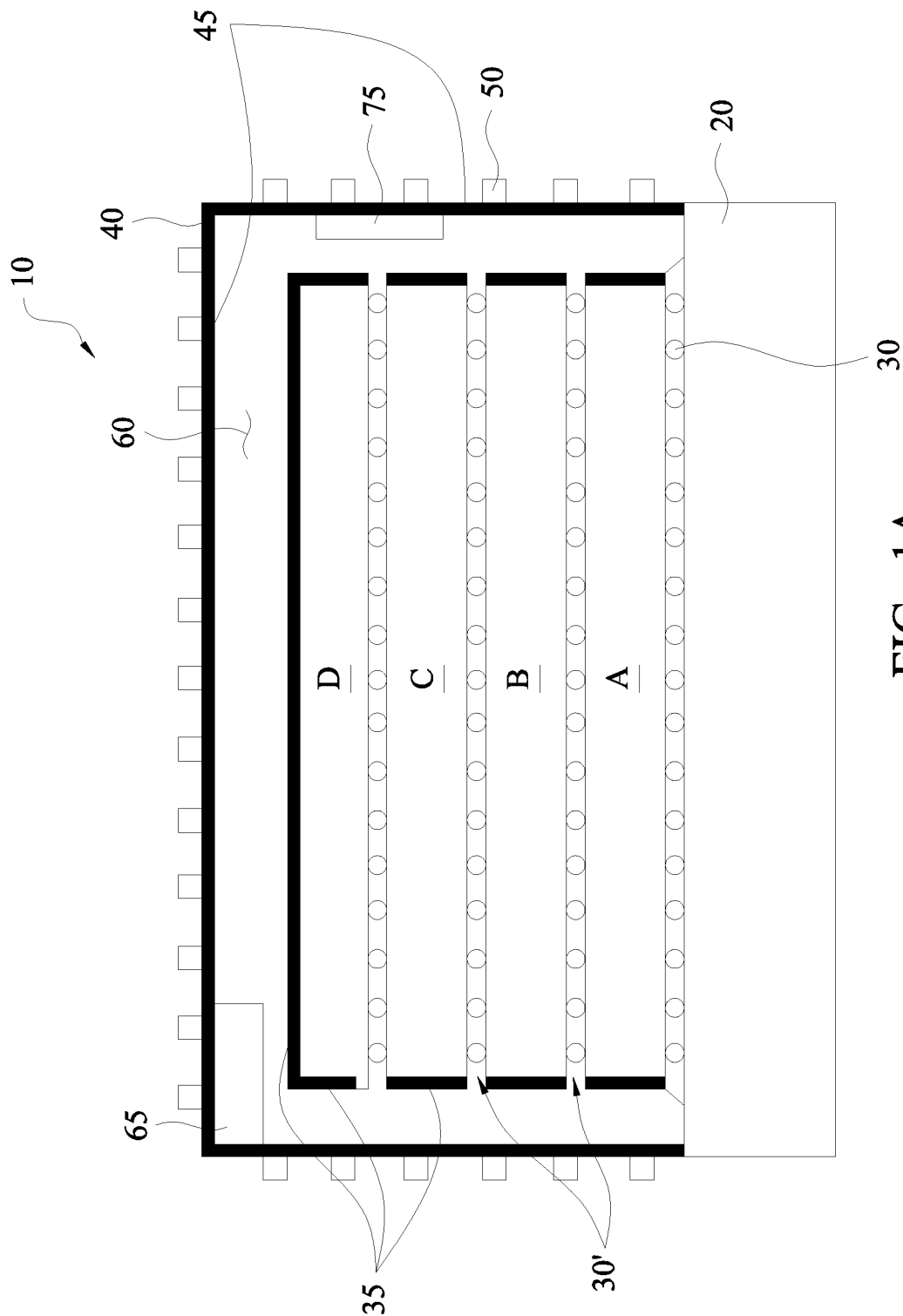
FIG. 1A is a cross-sectional view of a stacked package according to some embodiments.

FIG. 1A is a cross-sectional view of a stacked package 10 according to some embodiments. Stacked package 10 includes a substrate 20, a first structure A, a second structure B, a third structure C, a fourth structure D, a housing 40 and a cooling fluid 60 contained in a cavity of housing 40. A hydrophilic coating 35 is on exposed surfaces of structures A, B, C and D. A hydrophilic coating 45 is on an inner surface of housing 40. Structures A, B, C, and D are bonded together by bumps 30. A hydrophilic coating 30' is on an exposed surface of bumps 30 located at a periphery of structures A, B, C and D.

Although FIG. 1A shows the stacked package 10 as having four structures A, B, C, and D stacked upon one another, one skilled in the art will understand that the stacked package 10 has two or more structures stacked one upon the other in some embodiments while in other embodiments the stacked package 10 may have more than four structures.

To address heat dissipation in stacked package 10, structures A, B, C, and D are immersed in cooling fluid 60. A volume of cooling fluid 60 is contained in housing 40 with the housing 40 hermetically sealing structures A, B, C, and D from ambient air or some other environment. Cooling fluid 60 both cools and insulates structures A, B, C, and D. Cooling fluid 60 helps cool structures A, B, C, and D by absorbing heat generated by operating devices within structures A, B, C, and D and drawing the heat away from the structures to the walls of housing 40 where the heat is then dissipated to a surrounding environment.

Substrate 20 may comprise a silicon substrate although other semiconductor substrates, such as silicon-germanium substrate, III-V compound substrate, glass substrate, or silicon on insulator (SOI) substrate may be utilized in various embodiments.

In some embodiments, structures A, B, C, and D independently include one of a processor die, memory die (e.g., SRAM, DRAM), power device die, an ASIC (application specific integrated circuit) die, or other functional device dies. In some embodiments, structures A, B, C, and D independently include an interposer, a passive die, or another suitable connecting structure. In some embodiments, structures A, B, C, and D independently include a plurality of through silicon vias (TSVs) (not shown) for inter-die communication, silicon or other semiconductor materials and may include one or more conductive layers (not shown). In some embodiments, multiple metallization layers (not shown) are formed within structures A, B, C, and D, and structures A, B, C, and D independently include a plurality of other layers, such as inter-metal dielectric (IMD) layers (not shown). In some embodiments, structures A, B, C, and D independently include other active components or circuits, such as transistors, capacitors, and other devices. In some embodiments, an underfill is located between substrate 20 and a structure A, B, C or D closest to the substrate to help increase mechanical strength of stacked package 10.

Exposed surfaces of structures A, B, C, and D include hydrophilic coating 35 to help increase direct contact between cooling fluid 60 and the structures. As an amount of direct contact between the cooling fluid 60 and structures A, B, C and D increases, efficiency of heat transfer from the structures to the cooling fluid 60 increases. Hydrophilic coating 35 has a high thermal conductivity to facilitate efficient heat transfer from structures A, B, C, and D to cooling fluid 60. The increase in heat transfer efficiency helps to maintain a constant temperature within structures A, B, C and D within an acceptable operating range. In some embodiments, hydrophilic coating 35 includes a metallic layer. In some embodiments, the metallic layer includes a plurality of pillars. In some embodiments, at least one of the plurality of pillars has an increased surface roughness in comparison with a plated then etched pillar. The increased surface roughness on a pillar structure helps to increase surface area of hydrophilic coating 35 in order to facilitate more efficient heat transfer. In some embodiments, hydrophilic coating 35 extends along a surface of structures A, B, C, and D closest to an adjacent structure from an outer edge of the structure to an outer most bump 30. Hydrophilic coating 35 extends across substantially an entirety of a surface of structure D farthest from substrate 20.

Bumps 30 provide electrical connections between structures A, B, C, and D. In some embodiments, bumps 30 are solder balls, conductive pillars, or other suitable connecting elements. In some embodiments, hydrophilic coating 30' is on exposed bumps 30 along a periphery of structures A, B, C and D. Hydrophilic coating 30' has a high thermal conductivity to facilitate efficient heat transfer from bumps 30 to cooling fluid 60. In some embodiments, hydrophilic coating 30' includes a metallic layer. In some embodiments, the metallic layer includes a plurality of pillars. In some embodiments, hydrophilic coating 30' is a same coating as hydrophilic coating 35. In some embodiments, hydrophilic coating 30' is different from hydrophilic coating 35.

Housing 40 defines a cooling fluid compartment and contains cooling fluid 60 therein. Housing 40 has a generally rectangular shape but other shapes are also contemplated, such as a shape or design capable of placing the cooling fluid 60 and structures A, B, C, and D in efficient heat exchange with one another. In some embodiments, housing 40 is constructed of a thermally conductive material, such as steel, aluminum, copper, silver, metal, silicon, or silicon carbide. Other materials, such as gold, though perhaps less cost effective than those already mentioned, are also thermally conductive to an adequate degree and are used in certain embodiments.

To assist cooling of structures A, B, C, and D, in some embodiments an outside surface of housing 40 includes a plurality of radiators or fins 50 for heat dissipation. In some embodiments, fins 50 are disposed on any or all of the outside surface(s) of housing 40. Fins 50 provide additional surface area for establishing heat transfer between housing 40 and the surrounding environment. In some embodiments, fins 50 are elongated for efficient thermal energy transfer to the surrounding environment and are constructed of a thermally conductive material such as steel, aluminum, copper, silver, metal silicon, or silicon carbide. One skilled in the art will understand that fins 50 are made from any material having a relatively high thermal conductivity. Although fins 50 as depicted in FIG. 1A are rectangular in shape, in some embodiments, fins 50 have a different shape, such as square, oval, circular, or a variety of other shapes capable of assisting with heat dissipation from stacked package 10. In some embodiments, fins 50 are affixed to an outer surface of housing 40 by soldering, brazing, bonding, or by some other manner. In some embodiments, fins 50 are formed integrally with housing 40.

In some embodiments, fins 50 include an inner space capable of receiving a coolant. In some embodiments, the coolant includes water, oil, antifreeze or another suitable coolant. In some embodiments, the coolant is circulated through fins 50 by a circulation system (not shown).

Inner surfaces of housing 40 include hydrophilic coating 45 to help increase direct contact between cooling fluid 60 and the housing. As an amount of direct contact between the cooling fluid 60 and housing 40 increases, efficiency of heat transfer from the cooling fluid to the surrounding environment through the housing increases. Hydrophilic coating 45 has a high thermal conductivity to facilitate efficient heat transfer from cooling fluid 60 to housing 40. The increase in heat transfer efficiency helps to maintain a constant temperature in cooling fluid 60 to permit the cooling fluid to absorb more heat from structures A, B, C, and D. In some embodiments, hydrophilic coating 45 includes a metallic layer. In some embodiments, the metallic layer includes a plurality of pillars. In some embodiments, at least one pillar of the plurality of pillars has an increased surface roughness in comparison with a plated then etched pillar. The increased surface roughness on a pillar structure helps to increase surface area of hydrophilic coating 45 in order to facilitate more efficient heat transfer. In some embodiments, hydrophilic coating 45 is a same coating as at least one of hydrophilic coating 35 or hydrophilic coating 30'. In some embodiments, hydrophilic coating 45 is different from at least one of hydrophilic coating 35 or hydrophilic coating 30'.

In some embodiments, cooling fluid 60 includes a fluid or liquid. As an example, cooling fluid 60 includes a fluid, such as oil, dielectric oil, water, a mixture of water and an anti-freezing agent, potassium formate, perfluorinate coolant, or the like. As a particular example, the cooling fluid 60 includes a non-electrically conductive liquid perfluorinate coolant, such as those made by 3M™ including 3M's HFE-7100 coolant and similar coolants.

In some embodiments, cooling fluid 60 includes a two-phase liquid, such as any two-phase liquid commercially available from various manufacturers. One skilled in the art will understand that cooling fluid 60 may be any fluid capable of absorbing and releasing energy and may be in a fluid form, such as water, gas, oil, or a mixture thereof.

In some embodiments, cooling fluid 60 is introduced into housing 40 prior to placing housing around structures A, B, C, and D. In some embodiments, substrate 20 is held by a vacuum chuck, a carrier wafer or another suitable support structure. Housing 40 is filled with a predetermined volume of cooling fluid 60 and is then placed around structures A, B, C, and D and bonded to substrate 20 to seal the cooling fluid within the housing. In some embodiments, cooling fluid 60 is introduced into housing 40 in a vacuum chamber or another suitable production tool.

In operation, a volume of cooling fluid 60, such as oil for example, heated by structures A, B, C, and D within housing 40 rises upwardly towards the top of housing 40. As the oil rises towards the top of the housing 40, upward flow is restricted and lateral flow occurs. Also, as heated oil cools, a density of the oil increases with a resultant downward flow aided by gravity. The downward flow is limited by the bottom of housing 40 consequently establishing a lateral flow to again bring the cooling fluid into engagement with the dies to begin the cycle anew. A level of cooling fluid 60 within housing 40 is maintained at a prescribed level to receive heat from structures A, B, C and D. The prescribed level is a minimum level of cooling fluid 60 during operation, e.g., a level of cooling fluid 60 receiving a maximum amount of heat during operation of devices within structures A, B, C and D. The prescribed level is above the surface of structure D farthest from substrate 20. In some embodiments, the prescribed level is a predetermined distance above the surface of structure D farthest from substrate 20.

In some embodiments, the stacked package 10 includes a pressure release apparatus 65. For convenience of illustration and ease of understanding, the pressure release apparatus 65 in FIG. 1A is depicted as a box. The pressure release apparatus 65 releases pressure within housing 40 caused by changes in volume of cooling fluid 60. When the temperature in the stacked package 10 increases, there is a corresponding increase in the volume of cooling fluid 60 which increases the pressure within housing 40. If the pressure within housing 40 is not offset, this pressure may rupture the housing 40 of the stacked package 10. The pressure release apparatus 65 releases the pressure within housing 40 to prevent such a rupture. In some embodiments, pressure release apparatus 65 is a valve. In some embodiments, pressure release apparatus 65 is configured to continuously release cooling fluid 60 or vaporized cooling fluid while the pressure within housing 40 is above a threshold value and stop releasing the cooling fluid or the vaporized cooling fluid when the pressure within the housing is at or below the threshold value. As one skilled in the art will understand the workings and construction of a pressure release apparatus, the details of such will not be described herein.

In some embodiments, stacked package 10 includes a deionizer 75 or an apparatus to deionize ions in the cooling fluid 60. During operation, in some embodiments, ions are introduced into cooling fluid 60 by interaction between the cooling fluid and components of the stacked package 10, such as structures A, B, C, D, or bumps 30. If the cooling fluid 60 is not de-ionized, conductivity of cooling fluid 60 increases which causes shorts in one or more structures A, B, C, or D, in some instances. One skilled in the art will appreciate how a deionizer is constructed and for convenience the details of such will not be described herein.

Figure 1B:
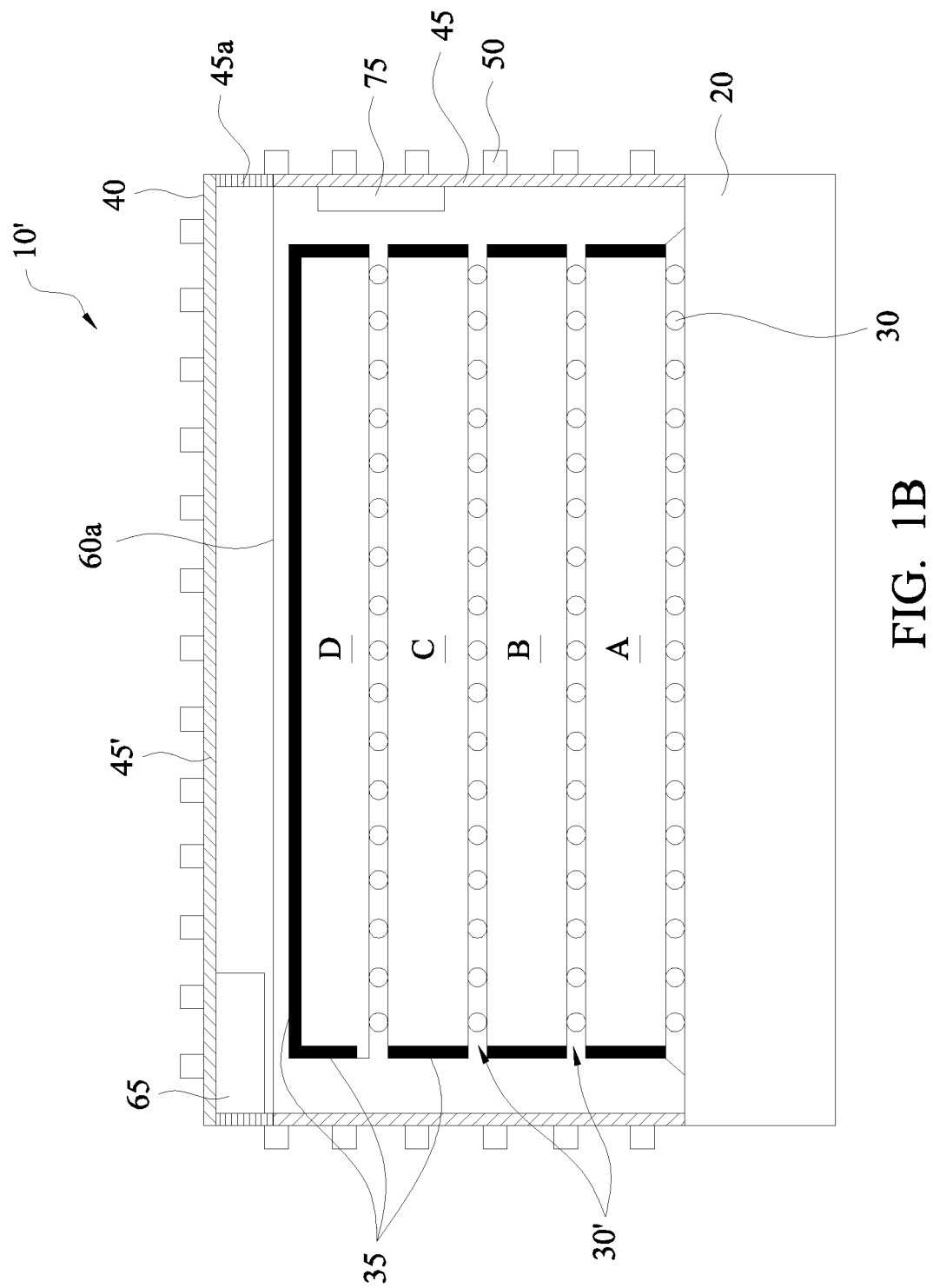
FIG. 1B is a cross-sectional view of a stacked package according to some embodiments.

FIG. 1B is a cross-sectional view of a stacked package 10' according to some embodiments. Stacked package 10' is similar to stacked package 10 (FIG. 1A). Same elements have a same reference number. In comparison with stacked package 10, cooling fluid 60 in stacked package 10' does not substantially fill housing 40. A top surface 60a of cooling fluid 60 is spaced from a top inner surface of housing 40. A space between top surface 60a and the top inner surface of housing 40 includes vaporized cooling fluid 60. Housing 40 of stacked package 10' also includes a hydrophobic coating 45' on the top inner surface of housing 40. A coating 45a on a portion of inner side surfaces of housing 40 is either hydrophilic or hydrophobic.

Hydrophobic coating 45' helps to maintain a level of cooling fluid 60 within housing 40. Hydrophobic coating 45' reduces an amount of cooling fluid 60 which remains on the top surface of housing following condensation. During operation, cooling fluid 60 is heated by structures A, B, C, and D. A portion of cooling fluid 60 evaporates due to the increased temperature of the cooling fluid. When the vaporized cooling fluid contacts the top inner surface of housing 40, heat is transferred to the surrounding environment through the housing. The vaporized cooling fluid then condenses back into a liquid state. Hydrophobic coating 45' helps to increase a contact angle between the condensate and the top inner surface of housing 40. The increased contact angle causes the condensate to form a droplet and fall back into cooling fluid 60. In some embodiments, hydrophobic coating 45' includes an organic material. In some embodiments, hydrophobic coating 45' includes trichloro(1H,1H,2H,2H-perfluorooctyl)silane, 1H,1H,2H,2H-perfluorodecyltrimethosxysilane, 1H,1H,2H,2H-perfluorodecyldimethylchlorosilane, or another suitable hydrophobic material.

Coating 45a is located on a top portion of the inner sidewall of housing 40 above a top surface 60a of cooling fluid 60 at an operating temperature of stacked package 10'. In some embodiments, coating 45a is entirely a hydrophilic coating, such as hydrophilic coating 45. In some embodiments, coating 45a is entirely a hydrophobic coating, such as hydrophobic coating 45'. In some embodiments, a first portion of coating 45a is hydrophilic and a second portion of coating 45a is hydrophobic. The second portion of coating 45a is located closer to the top inner surface of housing 40 than the first portion of coating 45a. In some embodiments, a ratio of a length of the first portion to a length of the second portion along inner sidewalls of housing 40 is based on a location of top surface 60a. In some embodiments, an interface of the first portion of coating 45a and the second portion of coating 45a is co-planar with the location of top surface 60a at an operating temperature of stacked package 10'. The location of top surface 60a depends on a material of cooling fluid 60 and the operating temperature of stacked package 10'. As a vapor pressure of cooling fluid 60 increases, the top surface 60a is located closer to the top inner surface of housing 40. As an operating temperature of stacked package 10' increases, the top surface 60a is located farther from the top inner surface of housing 40 due to greater vaporization of cooling fluid 60. The vaporization of cooling fluid 60 converts a portion of a volume of the cooling fluid from a liquid state to a gaseous state which increases a distance between top surface 60a and the top inner surface of housing 40.

The first portion of coating 45a will help to increase heat transfer efficiency in a similar manner as hydrophilic coating 45. In some embodiments where the first portion coating 45a extends above top surface 60a, the first portion of the coating 45a will act to maintain a volume of cooling fluid 60 away from contact with structures A, B, C, and D. The volume of cooling fluid 60 kept away from structures A, B, C, and D reduces an amount of the cooling fluid available to absorb heat from the structures.

The second portion of coating 45a will help to return condensed cooling fluid 60 to the cooling fluid surrounding structures A, B, C, and D. In some embodiments where the second portion of coating 45a extends below top surface 60a, the second portion of coating 45a prevents efficient heat transfer from cooling fluid 60 to housing 40. The reduced efficiency of heat transfer from cooling fluid 60 to housing 40 results in an increase in the temperature of the cooling fluid. As the temperature in cooling fluid 60 increases, a driving force for heat transfer from structures A, B, C, and D to the cooling fluid is reduced. The reduced driving force for heat transfer means a temperature of structures A, B, C, and D increases, which in turn increases a risk of damage to the structures.

Figure 3:
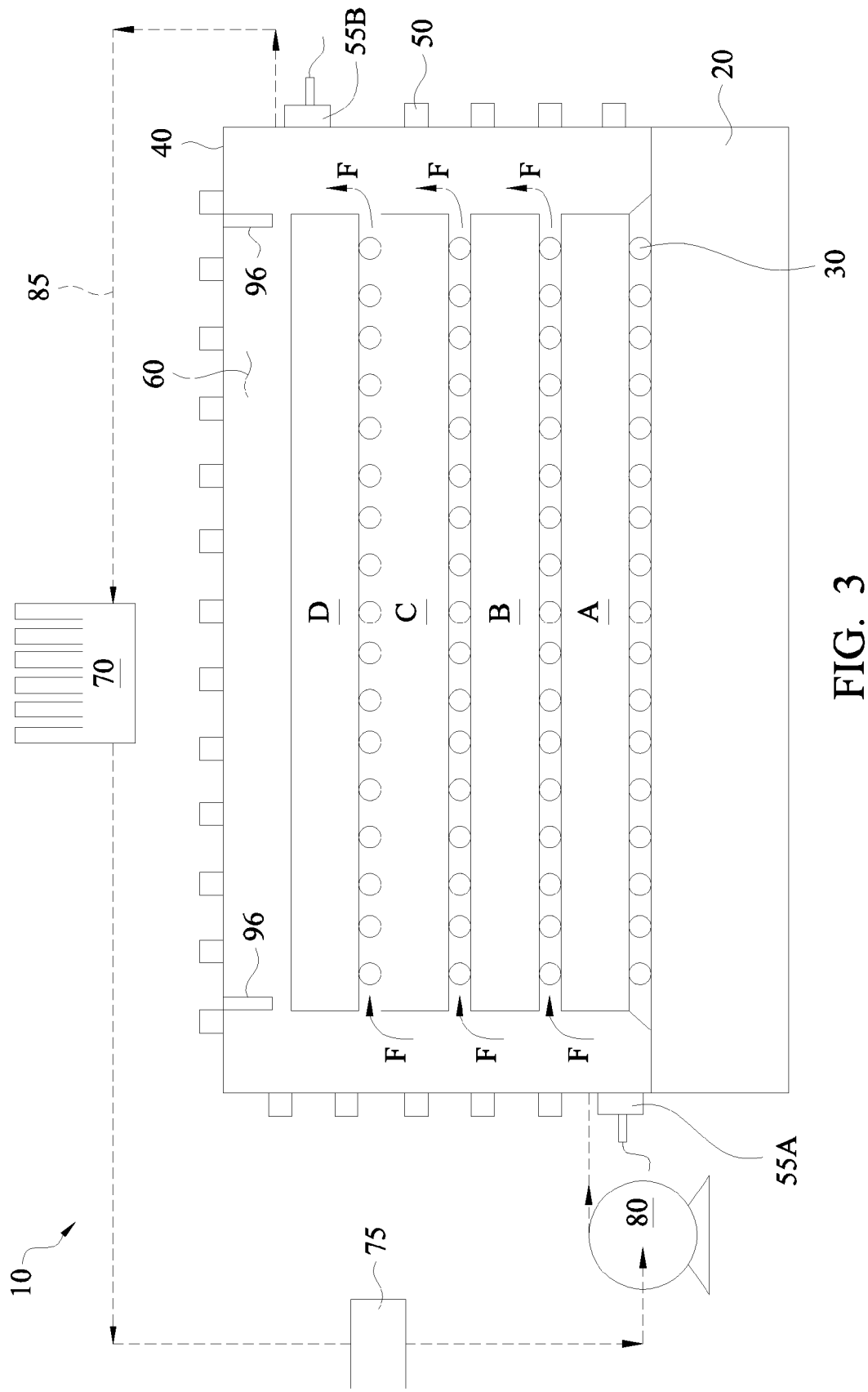
FIG. 3 is a cross-sectional view of a stacked package according to some embodiments.

Maintaining the level of the cooling fluid 60 at a prescribed level helps to maintain efficient heat transfer. Accordingly, in some embodiments, the location of top surface 60a of the cooling fluid 60 is monitored during operation. Monitoring the location of top surface 60a reduces the risk of excessive temperature increases and the associated problems. In some embodiments, stacked package 10 includes temperature sensors 55A and 55B (FIG. 3). Temperature sensors 55A and 55B are positioned at one or more places on an exterior wall portion of housing 40. Positioning temperature sensors 55A and 55B on an exterior wall of housing 40 makes removing and replacing the temperature sensors less time consuming and less expensive.

Figure 2:
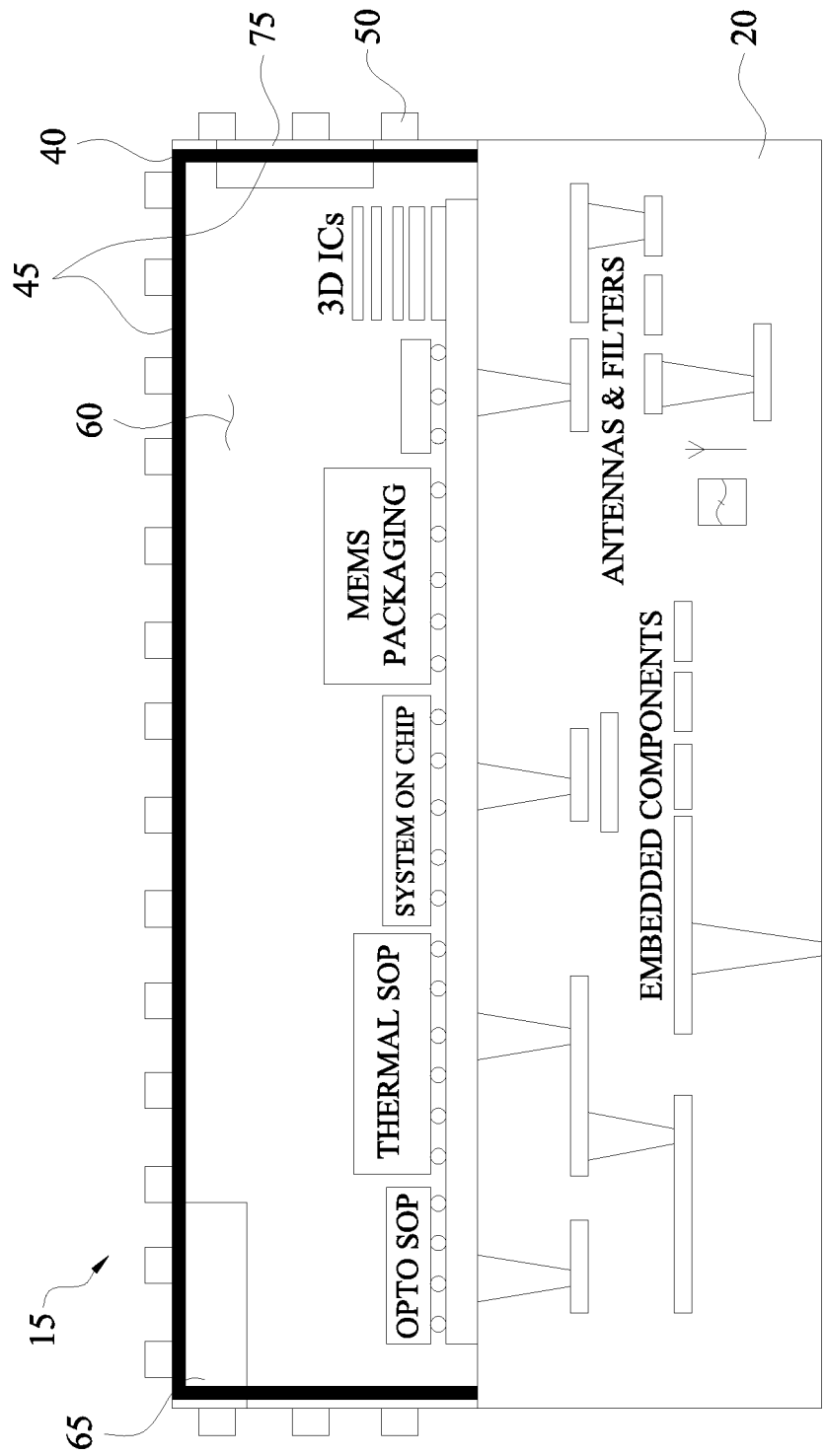
FIG. 2 is a cross-sectional view of a multi-chip system package according to some embodiments.

FIG. 2 is a cross-sectional view of a multi-chip system package 15 according to some embodiments. The multi-chip system package 15 includes many different chips, such as stacked chips, and components, such as 3D IC packages, MEMs packaging, system on chips (SOCs), THERMAL SOPs, OPTO SOPs, embedded components, antennas and filters, and the like. A volume of cooling fluid 60 is contained in housing 40. Cooling fluid 60 both cools and insulates the components of multi-chip system package 15. The cooling fluid 60 helps cool the components by absorbing heat generated by the components and drawing the absorbed heat to the walls of housing 40 where the absorbed heat is then dissipated to the surrounding environment. In some embodiments, an outside surface of housing 40 includes a plurality of radiators or fins 50 for additional heat dissipation.

Although cooling fluid circulation within housing 40 is achievable by passive means as described above, in some embodiments an active pumping action with the use of a pump 80 is employed to circulate cooling fluid 60. FIG. 3 depicts the stacked package 10 of FIG. 1A having a pump 80 and a conduit 85. FIG. 3 does not depict a pressure release apparatus 65 for ease of illustration. In some embodiments, the assembly of FIG. 3 includes pressure release apparatus 65 similar to the assembly of FIG. 1A. Similarly, hydrophilic coating 35, hydrophilic coating 30', hydrophilic coating 45, and hydrophobic coating 45' are not included in FIG. 3 for ease of review. In some embodiments, hydrophilic coating 35, hydrophilic coating 30', hydrophilic coating 45, or hydrophobic coating 45' are included in the assembly of FIG. 3.

One end of conduit 85 is connected to an inlet or opening in housing 40 and the other end of the conduit 85 is connected to an outlet or opening in housing 40. FIG. 3 indicates that the inlet is closer to substrate 20 than the outlet. In some embodiments, the outlet is closer to substrate 20 than the inlet. In some embodiments, the outlet and the inlet are spaced an equal distance from substrate 20. In some embodiments, conduit 85 is a pipe, tube or another suitable passageway for allowing cooling fluid 60 to circulate from the outlet to the inlet. Pump 80 is coupled to conduit 85 for pumping the cooling fluid 60 from the outlet to the inlet of housing 40. Pump 80 is an apparatus for circulating the cooling fluid by means of a piston, plunger, or a set of rotating vanes, or another suitable circulating apparatus. In operation, in some embodiments, pump 80 forces cooling fluid 60 from a bottom region of housing 40, where the cooling fluid is generally cooler, to an upper region of housing 40 where the cooling fluid is generally warmer as compared to the cooling fluid at the bottom region. The circulation of cooling fluid 60 from the lower region to the upper region of housing 40 cools structures A, B, C, and D.

In operation, cooling fluid 60 passes along sidewalls of structures A, B, C, and D. Cooling fluid 60 also passes between adjacent structures A, B, C, and D. Cooling fluid 60 contacts bumps 30 which provide a heat transfer interface in addition to the surfaces of structures A, B, C, and D. In some embodiments, cooling fluid 60 does not pass between structure A and substrate 20 due to the presence of an underfill layer.

The above description of circulating cooling fluid 60 is also applicable to the multi-chip system package 15 of FIG. 2. Cooling fluid 60 contained within housing 40 in these embodiments and others is able to be circulated by one or more methods, such as by gravity, an active pumping action, such as with the mechanical pump described above, a passive pumping action, such as with a wicking action, a thermal siphoning action, or the like.

Still referring to FIG. 3, in some embodiments stacked package 10 includes one or more barriers 96 disposed within the housing 40 of the stacked die package 10. Barriers 96 help direct the fluid flow F of cooling fluid 60, particularly to areas between two stacked structures, in the region of the bumps 30. Without barriers 96, a substantial amount of cooling fluid 60 will flow over the top of the topmost structure D or around the sides of the dies A, B, C and D, in some instances, as fluid flow will generally take the path of least resistance. A configuration or shape of barriers 96 is not limited so long as such configuration or shape directs the fluid flow F substantially to regions between the structures (e.g., to the region of the bumps 30) and substantially blocks at least a portion of fluid flow over the top of the topmost structure D or around the sides of the stacked structures A, B, C and D.

To further dissipate heat and enhance the cooling of cooling fluid 60, in another embodiment, a heat sink 70 is thermally coupled to conduit 85. Heat sink 70 draws heat from cooling fluid 60 to the surrounding environment thereby causing cooling of cooling fluid 60. In some embodiments, heat sink 70 includes fins or other heat dissipating elements.

According to some embodiments, temperature sensor 55A is fitted at or near the inlet in housing 40, whereas temperature sensor 55B is positioned at or near the outlet in housing 40. Although two temperature sensors are indicated in FIG. 3, a person skilled in the art will appreciate that in some embodiments one temperature sensor or more than two temperature sensors are usable. Temperature sensors 55A and 55B are located at a location below a top surface of cooling fluid 60. In some embodiments, temperature sensors 55A and 55B are resistive temperature sensors that indicate a change in temperature by a change in electrical resistance. The measured temperature is dependent on the level of the cooling fluid 60, the ambient temperature, and a given stacked package design. To read the measured outputs of the temperature sensors, the stack package 10 includes a specific purpose computer (not shown) having suitable computer control algorithms to receive the outputs and provide information indicative of an operation property of stacked package 10 from the measured temperatures. In some embodiments, calculating the level of the cooling fluid 60 in the housing 40 includes the specific purpose computer comparing a value associated with the measured outputs from temperature sensor 55A or 55B with predetermined values expected for a normal operation condition. If a difference between the predetermined outputs and measured outputs from temperature sensor 55A or 55B is above a threshold value, the specific purpose computer is arranged to generate an alarm condition, in some embodiments. In some embodiments, the specific purpose computer is arranged to generate a warning signal when the cooling fluid 60 level drops below a prescribed minimum level. In some embodiments, the specific purpose computer is configured to generate a control signal for controlling pump 80 to adjust a flow rate of cooling fluid 60. As a flow rate of cooling fluid 60 increases, an amount of heat the cooling fluid absorbs from structures A, B, C and D increases. The increased amount of heat absorbed by cooling fluid 60 is dissipated into the surrounding environment by heat sink 70.

Figure 4:
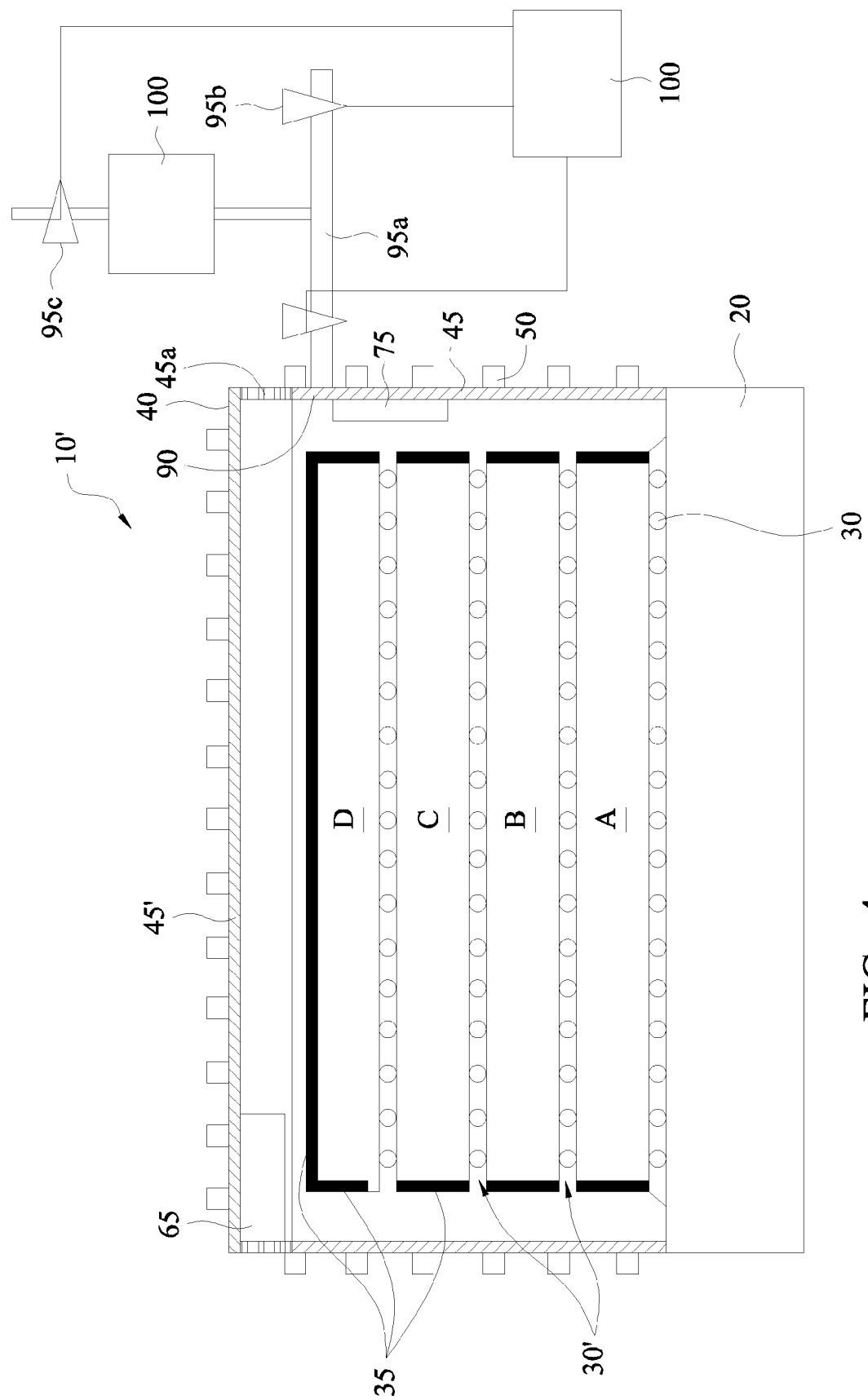
FIG. 4 is a cross-section view of a stacked package according to some embodiments.

FIG. 4 is a cross-section view of a stacked package 10' according to some embodiments. Stacked package 10' in FIG. 4 is similar to stacked package 10' in FIG. 1B. Same elements have a same reference number. In comparison with stacked package 10' in FIG. 1B, stacked package 10' in FIG. 4 includes a single port 90. Port 90 is configured to provide both an inlet and an outlet for cooling fluid 60. A flow of cooling fluid 60 into or out of housing 40 is controlled by valves 95a, 95b and 95c. A reservoir 100 connected to port 90 is configured to help relieve pressure within housing 40 and to store additional cooling fluid 60.

In comparison with the circulation system in FIG. 3, FIG. 4 includes just one port 90 for both inlet and outlet of cooling fluid 60. Valve 95a is configured to selectively connect an interior of housing 40 with reservoir 100. Reservoir 100 helps to relieve pressure within housing 40 while avoiding releasing a volume of cooling fluid 60 through pressure release apparatus 65. During operation, as cooling fluid 60 absorbs heat from structures A, B, C, and D, the cooling fluid expands and a portion of the cooling fluid evaporates. When valve 95a is open the volume of cooling fluid 60 is able to expand into reservoir 100 instead of just increasing the pressure within housing 40. When cooling fluid 60 cools, the cooling fluid within reservoir 100 is able to return to housing 40 through valve 95a without having to supply a new volume of cooling fluid.

The use of reservoir 100 helps to reduce the risk of damage to housing 40 or structures A, B, C, and D resulting from increased pressure during operation. Reservoir 100 also helps to conserve cooling fluid 60 by relieving pressure within housing 40 without venting the cooling fluid into the surrounding environment through pressure release apparatus 65.

Valve 95b is able to connect housing 40, through valve 95a, to a cooling fluid supply (not shown). In some embodiments, a pump, such as pump 80, is usable to supply a volume of cooling fluid 60 to housing 40 through valve 95b and valve 95a.

Valve 95c is able to connect housing, through valve 95a and reservoir 100, without a cooling fluid discharge (not shown). In some embodiments, a pump, such as pump 80, is usable to remove a volume of cooling fluid 60 from housing 40 through valve 95a, reservoir 100 and valve 95c. In some embodiments, the cooling fluid discharge is connected to the cooling fluid supply.

In some embodiments, valves 95a, 95b and 95c are controlled to regulate a level of cooling fluid 60 within housing 60. In some embodiments, a controller 150 is connected to valves 95a, 95b and 95c in order to control the valves. In some embodiments, controller 150 includes an algorithm for controlling valves 95a, 95b and 95c based on a temperature of cooling fluid 60, a volume of the cooling fluid, or a pressure within housing 40. In some embodiments, as the temperature of cooling fluid 60 increases above a first temperature threshold controller 150 controls valve 95a in order to connect housing to reservoir 100. In some embodiments, as the temperature of cooling fluid 60 increases above a second temperature threshold, greater than the first temperature threshold, controller 150 controls valves 95b and 95c in order to circulate cooling fluid 60 to help decrease the temperature of the cooling fluid.

In some embodiments, as the volume of cooling fluid 60 decreases controller controls valve 95a and valve 95b in order to increase the volume of the cooling fluid within housing 40. In some embodiments, as the volume of cooling fluid 60 increases controller 150 controls valve 95a and valve 95c in order to reduce the volume of the cooling fluid within housing 40.

In some embodiments, as the pressure within housing 40 increases above a pressure threshold controller 150 controls valve 95a and valve 95c in order to discharge a portion of cooling fluid 60 to reduce the pressure within the housing.

In some embodiments, controller 150 includes a process configured to execute instructions for controlling valves 95a, 95b and 95c. In some embodiments, controller 150 includes a non-transitory computer readable memory for storing instructions and parameters for controlling valves 95a, 95b and 95c. In some embodiments, controller 150 includes an input/output (I/O) interface for sending and receiving information to or from an operator or other devices such as temperature sensors, pressure sensors, a keyboard, a mouse, or other suitable devices. In some embodiments, controller 150 includes a network interface for wirelessly connecting to at least one of valves 95a, 95b or 95c or other devices such as temperature sensors, pressure sensors, or other suitable devices.

Figure 5:
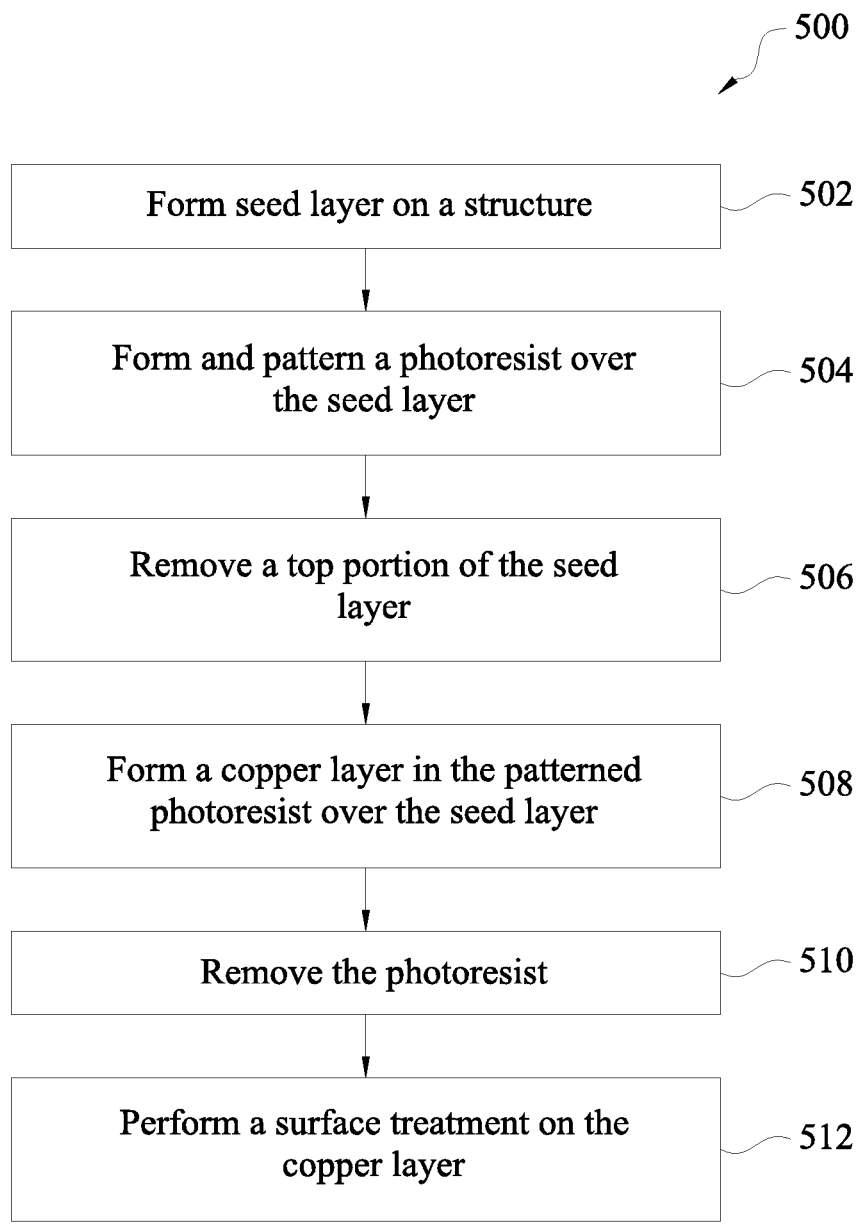
FIG. 5 is a flowchart of a method of making a hydrophilic coating on a surface of a structure according to some embodiments.

FIG. 5 is a flowchart of a method 500 of making a hydrophilic coating on a surface of a structure according to some embodiments. In some embodiments, method 500 describes forming hydrophilic coating 35 on at least one of structure A, B, C, or D. In operation 502, a seed layer is formed on the structure. In some embodiments, the seed layer is a single material. In some embodiments, the seed layer is a multi-layer seed layer. In some embodiments, the seed layer is formed using chemical vapor deposition (CVD), physical vapor deposition (PVD), sputtering, atomic layer deposition (ALD), plating, or another suitable formation process. In some embodiments, the seed layer includes copper, titanium, or another suitable material.

Figure 6A:
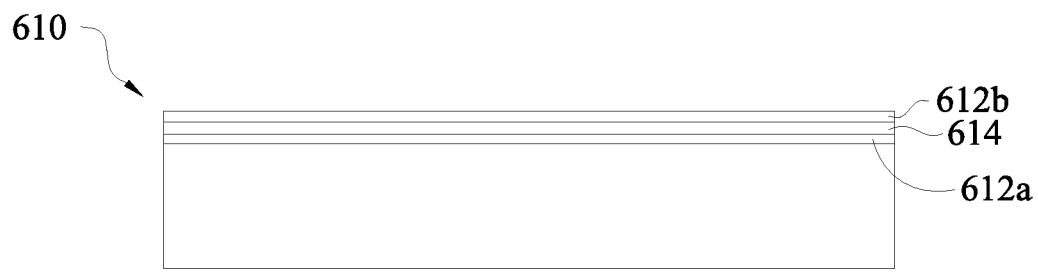
FIGS. 6A-6D are cross-sectional views of a hydrophilic coating at various stages of production according to some embodiments.

FIG. 6A is a cross-sectional view of a hydrophilic coating following operation 502 according to some embodiments. FIG. 6A includes a seed layer 610 formed on a structure, such as structure A, B, C, or D. Seed layer 610 includes a first titanium layer 612a closest to the structure. In some embodiments, first titanium layer 612a is in direct contact with the structure. In some embodiments, an intermediate layer is between first titanium layer 612a and the structure to increase adhesive between the first titanium layer and the structure. A copper layer 614 is over first titanium layer 612a. A second titanium layer 612b is over copper layer 614.

Returning to FIG. 5, a photoresist is formed over the seed layer and the photoresist is patterned in operation 504. In some embodiments, the photoresist is formed by spin-on coating, PVD or another suitable formation process. In some embodiments, the photoresist is patterned using an etching process. In some embodiments, the etching process includes a lithography step. In some embodiments, the patterned photoresist is subjected to an oxygen plasma treatment in order to increase wettability of the patterned photoresist for subsequent processing, such as plating of a copper layer.

Figure 6B:
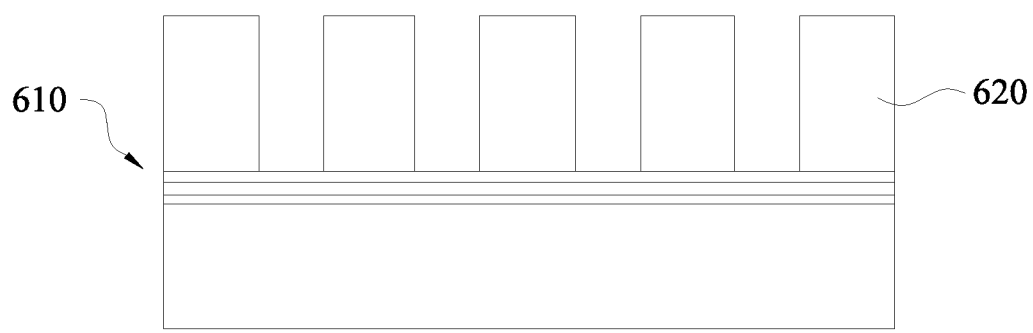

FIG. 6B is a cross-sectional view of the hydrophilic coating following operation 504 according to some embodiments. A photoresist 620 is formed over seed layer 610. Photoresist 620 is then patterned to form a plurality of openings within the photoresist.

Returning to FIG. 5, a top portion of the seed layer is removed in operation 506. In some embodiments including a single layer seed layer, operation 506 is omitted. In some embodiments, the top portion of the seed layer is removed by etching the seed layer through the patterned photoresist. In some embodiments, the etching process includes a hydrofluoric acid solution or another suitable etchant. In some embodiments, the etching process includes multiple etching steps. For example, in some embodiments which include a multi-layer seed layer as in FIG. 6A, a portion of second titanium layer 612b is removed using a hydrofluoric acid solution then an oxide layer is removed from copper layer 614 using a hydrochloric acid solution.

In operation 508, a copper layer is formed over the seed layer in the openings of the patterned photoresist. In some embodiments, the copper layer is formed by plating, PVD, sputtering or another suitable formation process. In some embodiments, the plating process is accompanied by a sonication process.

Figure 6C:
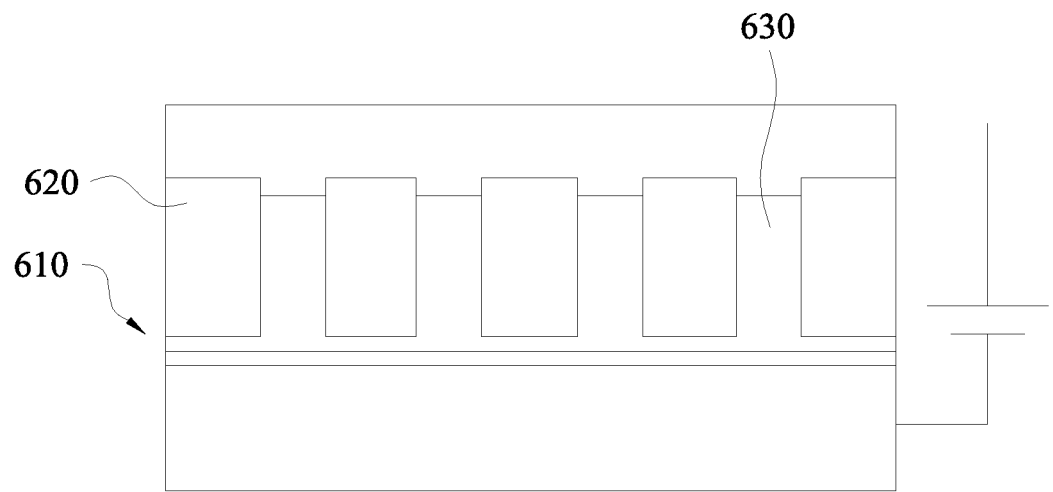

FIG. 6C is a cross-sectional view of the hydrophilic coating following operation 508 according to some embodiments. A copper layer 630 is plated over seed layer 610 within openings of photoresist 620.

Returning to FIG. 5, the photoresist is removed in operation 510. In some embodiments, the photoresist is removed using a stripping solution, an ashing process, or another suitable photoresist removal process. The copper layer formed in operation 508 is substantially undamaged during the removal of the photoresist.

In operation 512, a surface treatment is performed on the copper layer. The surface treatment is performed on a top surface of the copper layer and portions of the copper layer exposed by removing the photoresist. The surface treatment increases a surface roughness of the copper layer. The increased surface roughness increases a surface area of the copper layer contacting a cooling fluid, e.g., cooling fluid 60 (FIG. 1A), which in turn increases efficiency of heat transfer from the copper layer to the cooling fluid. In some embodiments, the surface treatment includes immersing the copper layer in an alkali solution. In some embodiments, the alkali solution includes $NaClO_2$, NaOH, $Na_3PO_4$, or $H_2O$. In some embodiments, the surface treatment forms needle-shaped nanostructures on surfaces of the copper layer.

In some embodiments, the surface treatment of operation 512 also increases surface roughness of bumps, e.g., bumps 30 (FIG. 1A), attached to the structure. For example, in some embodiments, peripheral bumps 30 bonding structures A, B, C, and D together that are exposed to the surface treatment process. The surface roughness of the peripheral bumps is increased in comparison with a surface roughness of the bumps which are not exposed to the surface treatment. In some embodiments, more bumps than just peripheral bumps bonded to the structure are subjected to the surface treatment process. In some embodiments, substantially all bumps bonded to the structure are subjected to the surface treatment process.

Figure 6D:
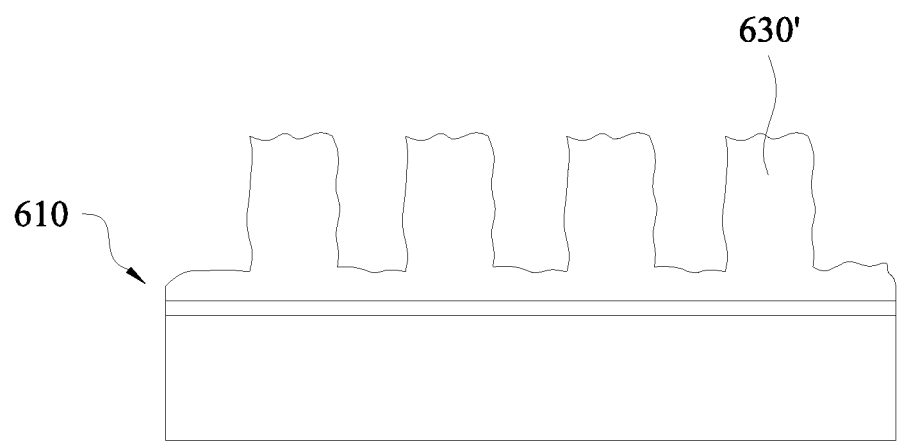

FIG. 6D is a cross-sectional view of the hydrophilic coating following operation 512 according to some embodiments. In comparison with FIG. 6C, photoresist 620 is removed. Copper layer 630' includes an enhanced surface roughness in comparison with the surface roughness of copper layer 630 in FIG. 6C. The enhanced surface roughness of copper layer 630' increases a surface area for heat transfer in comparison with copper layer 630.

In some embodiments, method 500 includes additional operations such as bonding structures, e.g., structures A, B, C, and D (FIG. 1A), together, forming an underfill between a substrate and the structure, or other suitable operations.

Figure 7:
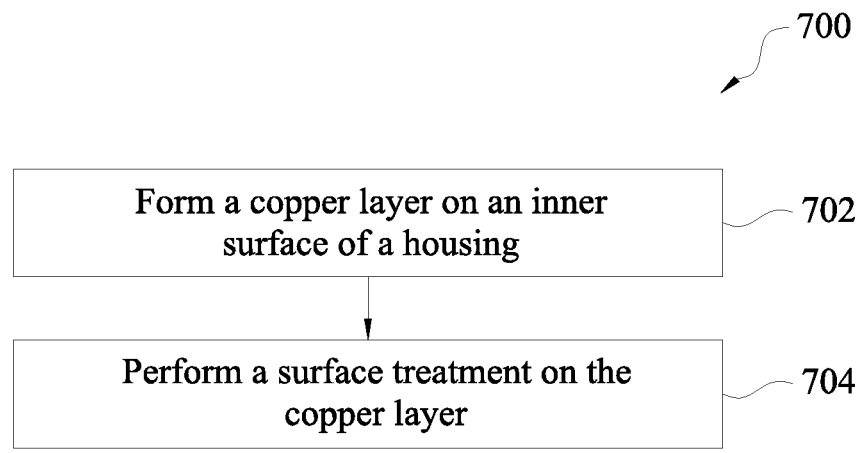
FIG. 7 is a flowchart of a method of making a hydrophilic coating on a housing according to some embodiments.

FIG. 7 is a flowchart of a method 700 of a making a hydrophilic coating on a housing according to some embodiments. Method 700 begins with operation 702 in which a copper layer is formed on an inner surface of a housing. In some embodiments, the copper layer is formed by sintering a copper powder on the inner surface of the housing, e.g., housing 40 (FIG. 1A). In some embodiments, the copper layer is formed by plating, ALD, PVD, or another suitable formation process.

In operation 704, a surface treatment is performed on the copper layer. The surface treatment increases a surface roughness of the copper layer. The increased surface roughness increases a surface area of the copper layer contacting a cooling fluid, e.g., cooling fluid 60 (FIG. 1A), which in turn increases efficiency of heat transfer from the cooling fluid to the housing. In some embodiments, the surface treatment includes immersing the copper layer in an alkali solution. In some embodiments, the alkali solution includes $NaClO_2$, NaOH, $Na_3PO_4$, or $H_2O$. In some embodiments, the surface treatment forms needle-shaped nanostructures on surfaces of the copper layer. In some embodiments, the surface treatment of operation 704 is a same surface treatment as the surface treatment of operation 512. In some embodiments, the surface treatment of operation 704 is different from the surface treatment of operation 512.

In some embodiments, additional operations are included in method 700, such as forming a seed layer, forming a patterned photoresist or another suitable operation.

Figure 8:
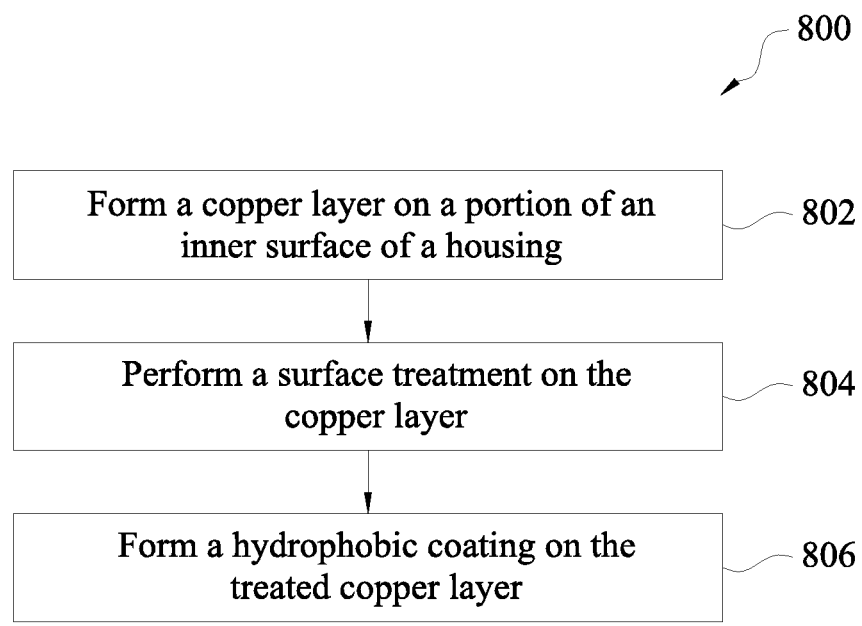
FIG. 8 is a flowchart of a method of making a hydrophobic coating on a housing according to some embodiments.

FIG. 8 is a flowchart of a method 800 of a making a hydrophobic coating on a housing according to some embodiments. Method 800 begins with operation 802 in which a copper layer is formed on an inner surface of a housing. In some embodiments, the copper layer is formed by sintering a copper powder on the inner surface of the housing, e.g., housing 40 (FIG. 1A). In some embodiments, the copper layer is formed by plating, ALD, PVD, or another suitable formation process. In some embodiments which include both a hydrophobic coating and a hydrophilic coating on the inner surface of the housing, e.g., stacked package 10' (FIG. 1B), operation 802 is performed simultaneously with operation 702. In some embodiments which include both a hydrophobic coating and a hydrophilic coating on the inner surface of the housing, operation 802 is performed sequentially with operation 702.

In operation 804, a surface treatment is performed on the copper layer. The surface treatment increases a surface roughness of the copper layer. In some embodiments, the surface treatment includes immersing the copper layer in an alkali solution. In some embodiments, the alkali solution includes $NaClO_2$, NaOH, $Na_3PO_4$, or $H_2O$. In some embodiments, the surface treatment forms needle-shaped nanostructures on surfaces of the copper layer. In some embodiments, the surface treatment of operation 804 is a same surface treatment as at least one of the surface treatment of operation 512 or operation 704. In some embodiments, the surface treatment of operation 704 is different from at least one of the surface treatment of operation 512 or operation 704. In some embodiments which include both a hydrophobic coating and a hydrophilic coating on the inner surface of the housing, e.g., stacked package 10' (FIG. 1B), operation 804 is performed simultaneously with operation 704. In some embodiments which include both a hydrophobic coating and a hydrophilic coating on the inner surface of the housing, operation 804 is performed sequentially with operation 704.

In operation 806, a hydrophobic coating is formed on the treated copper layer. In some embodiments, the hydrophobic coating is formed by ALD, CVD, an epitaxial process or another suitable formation process. In some embodiments, the hydrophobic coating includes trichloro(1H,1H,2H,2H-perfluorooctyl)silane. In some embodiments, the hydrophobic coating includes a different hydrophobic material.

In some embodiments, additional operations are included in method 800, such as forming a seed layer, forming a patterned photoresist or another suitable operation.

One aspect of this description relates to a stacked package. The stacked package includes a substrate, and a first structure bonded to the substrate. The first structure has a plurality of bumps, and a first hydrophilic coating is on sidewalls of the first structure. The stacked package further includes a second structure bonded to the plurality of bumps. The first hydrophilic coating is on sidewalls of the second structure. The first structure is between the second structure and the substrate. The stacked package further includes a housing, wherein the housing defines a volume enclosing the first structure and the second structure. A second hydrophilic coating is on sidewalls of an inner surface of the housing. The stacked package further includes a cooling fluid within the volume enclosing the first structure and the second structure. A top surface of the cooling fluid is above a top surface of the second structure.

Another aspect of this description relates to a stacked package. The stacked package includes a substrate, and a plurality of structures bonded to the substrate. Adjacent structures of the plurality of structures are bonded together by a plurality of bumps. The stacked package further includes a first hydrophilic coating on sidewalls of at least one structure of the plurality of structures. The stacked package further includes a housing, wherein the housing defines a volume enclosing the plurality of structures. The stacked package further includes a second hydrophilic coating on sidewalls of an inner surface of the housing. The stacked package further includes a hydrophobic coating on a top surface of the inner surface of the housing. The stacked package further includes a cooling fluid within the volume enclosing the plurality of structures. A top surface of the cooling fluid is above a top surface of a structure of the plurality of structures farthest from the substrate.

Still another aspect of this description relates to a method of making a stacked package. The method includes bonding a first structure to a substrate, and bonding a second structure to the first structure using a plurality of bumps. The method further includes forming a first hydrophilic coating on a sidewall surface of the first structure and on a sidewall surface of the second structure. The method further includes forming a second hydrophilic coating on sidewalls of an inner surface of a housing. The method further includes enclosing the first structure and the second structure using the housing to define a volume surrounding the first structure and the second structure. The method further includes filling at least a portion of the volume with a cooling fluid.

In the preceding detailed description, the present invention is described with reference to specifically exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. A stacked package comprising:
   a substrate;
   a first structure bonded to the substrate, wherein the first structure has a plurality of bumps, and a first hydrophilic coating is on sidewalls of the first structure;
   a second structure bonded to the plurality of bumps, wherein the first hydrophilic coating is on sidewalls of the second structure, and the first structure is between the second structure and the substrate;
   a housing, wherein the housing defines a volume enclosing the first structure and the second structure, and a second hydrophilic coating is on sidewalls of an inner surface of the housing; and
   a cooling fluid within the volume enclosing the first structure and the second structure, wherein a top surface of the cooling fluid is above a top surface of the second structure.

2. The stacked package of claim 1, wherein the second hydrophilic coating is on a top surface of the inner surface of the housing.

3. The stacked package of claim 1, wherein a hydrophobic coating is on a top surface of the inner surface of the housing.

4. The stacked package of claim 3, wherein the hydrophobic coating is on a portion of the sidewalls of the inner surface of the housing adjacent to the top surface of the inner surface of the housing.

5. The stacked package of claim 1, wherein the first hydrophilic coating comprises a patterned copper layer.

6. The stacked package of claim 5, wherein the patterned copper layer comprises needle-shaped nanostructures.

7. The stacked package of claim 1, wherein a distance from the substrate to a top of the second hydrophilic coating is different from a distance from the substrate to a top surface of the cooling fluid.

8. The stacked package of claim 7, wherein the top of the second hydrophilic coating is closer to the substrate than the top surface of the cooling fluid.

9. The stacked package of claim 1, further comprising at least one port in the housing, wherein the port is configured to permit flow of the cooling fluid into or out of the housing.

10. The stacked package of claim 9, further comprising a reservoir connected to the port wherein the reservoir is configured to store the cooling fluid.

11. The stacked package of claim 1, wherein a third hydrophilic coating is on at least one bump of the plurality of bumps.

12. The stacked package of claim 11, wherein the at least one bump is a peripheral bump located adjacent to an edge of the first structure, and the hydrophilic coating is on a sidewall of the peripheral bump closest to the edge of the first structure.

13. The stacked package of claim 1, wherein at least one of the first structure or the second structure is free of active devices.

14. A stacked package comprising:
    a substrate;
    a plurality of structures bonded to the substrate, wherein adjacent structures of the plurality of structures are bonded together by a plurality of bumps;
    a first hydrophilic coating on sidewalls of at least one structure of the plurality of structures;
    a housing, wherein the housing defines a volume enclosing the plurality of structures;
    a second hydrophilic coating on sidewalls of an inner surface of the housing;
    a hydrophobic coating on a top surface of the inner surface of the housing; and
    a cooling fluid within the volume enclosing the plurality of structures, wherein a top surface of the cooling fluid is above a top surface of a structure of the plurality of structures farthest from the substrate.

15. The stacked package of claim 14, wherein the hydrophobic coating is on a portion of the sidewalls of the inner surface of the housing adjacent to the top surface of the inner surface of the housing.

16. The stacked package of claim 14, wherein a bottom surface of the hydrophobic coating is farther from the substrate than the top surface of the cooling fluid.

17. The stacked package of claim 14, further comprising a third hydrophilic coating on at least one bump of the plurality of bumps.

18. The stacked package of claim 14, wherein the second hydrophilic coating is on an entirety of the sidewalls of the inner surface of the housing.

19. A method of making a stacked package, the method comprising:
- bonding a first structure to a substrate;
- bonding a second structure to the first structure using a plurality of bumps;
- forming a first hydrophilic coating on a sidewall surface of the first structure and on a sidewall surface of the second structure;
- forming a second hydrophilic coating on sidewalls of an inner surface of a housing;
- enclosing the first structure and the second structure using the housing to define a volume surrounding the first structure and the second structure; and
- filling at least a portion of the volume with a cooling fluid.

20. The method of claim 19, further comprising forming a hydrophobic coating on a top surface of an inner surface of the housing.

* * * * *